(12) United States Patent
Uhlig et al.

(10) Patent No.: US 11,615,994 B2
(45) Date of Patent: Mar. 28, 2023

(54) MODULE WITH GAS FLOW-INHIBITING SEALING AT MODULE INTERFACE TO MOUNTING BASE

(71) Applicant: Infineon Technologies AG, Neubiberg (DE)

(72) Inventors: Johannes Uhlig, Soest (DE); Sven Hagebusch, Lichtenfels (DE); Marco Ludwig, Wickede (DE); Ulrich Nolten, Rüthen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/201,239

(22) Filed: Mar. 15, 2021

(65) Prior Publication Data

US 2021/0305109 A1    Sep. 30, 2021

(30) Foreign Application Priority Data

Mar. 24, 2020    (EP) .................................... 20165269

(51) Int. Cl.
*H01L 23/10*    (2006.01)
*H01L 23/26*    (2006.01)
(52) U.S. Cl.
CPC .............. *H01L 23/26* (2013.01); *H01L 23/10* (2013.01)

(58) Field of Classification Search
CPC . H05K 5/06; H05K 3/30; H01L 23/26; H01L 23/10
See application file for complete search history.

(56) References Cited

U.S. PATENT DOCUMENTS

| | | | |
|---|---|---|---|
| 2009/0084602 A1 | 4/2009 | Fukuda et al. | |
| 2014/0111947 A1* | 4/2014 | Henniger | H01L 23/055 361/728 |
| 2016/0205796 A1 | 7/2016 | Henniger et al. | |
| 2017/0229377 A1* | 8/2017 | Ellsworth, Jr. | H01L 23/3737 |

FOREIGN PATENT DOCUMENTS

EP    3422399 A1    1/2019

* cited by examiner

*Primary Examiner* — Dale E Page
*Assistant Examiner* — Wilner Jean Baptiste
(74) *Attorney, Agent, or Firm* — Murphy, Bilak & Homiller, PLLC

(57) ABSTRACT

A module includes an electronic component, an enclosure at least partially enclosing the electronic component and defining a module interface at which the module is configured to be mounted on a mounting base, and a gas flow-inhibiting sealing at the module interface and configured to inhibit gas from propagating from an exterior of the module towards the electronic component. An electronic device that includes the module and a method of manufacturing the module are also described.

16 Claims, 2 Drawing Sheets

MODULE WITH GAS FLOW-INHIBITING SEALING AT MODULE INTERFACE TO MOUNTING BASE

BACKGROUND

Technical Field

Various embodiments relate generally to a module, an electronic device, and a method of manufacturing a module.

Description of Related Art

A power module provides the physical containment for one or more power components, such as power semiconductor devices. These power semiconductors may be soldered or sintered on a substrate which can be mounted, in turn, on a support body. A high effort may be involved for ensuring proper reliability of such a module.

SUMMARY

There may be a need to manufacture a module with high reliability and being usable even under harsh conditions.

According to an exemplary embodiment, a module is provided which comprises an electronic component, an enclosure at least partially enclosing the electronic component and defining a module interface at which the module is to be mounted on a mounting base, and a gas-flow inhibiting (in particular gas-flow tight) sealing at the module interface configured for inhibiting atmospheres (including gas) from propagating from an exterior of the module towards the electronic component.

According to another exemplary embodiment, an electronic device is provided, wherein the electronic device comprises a mounting base, and a module having the above-mentioned features and being mounted at its module interface on the mounting base with the sealing in between.

According to still another exemplary embodiment, a method of manufacturing a module is provided, wherein the method comprises at least partially enclosing an electronic component by an enclosure which defines a module interface at which the module is to be mounted on a mounting base, and providing a gas flow-inhibiting (in particular gas-flow tight) sealing at the module interface for inhibiting atmospheres (including gas) from propagating (in particular by convection) from an exterior of the module towards the electronic component when the module is mounted at the mounting base.

According to an exemplary embodiment, a module is provided in which an electronic component (such as a power semiconductor chip) is safely prevented from corroding due to the influence of corrosive gases in an environment of the module during operation. In long term operation of the module and under harsh conditions (such as the presence of hydrogen sulfide, H$_2$S, and other corrosive gases), it may happen that parts of an electronic component encapsulated or enclosed in an interior of the module are corroded by corrosive media. This may reduce reliability or may even completely damage the module. In order to overcome such issues, an exemplary embodiment sandwiches a gas flow-inhibiting sealing at a module interface at which the module is to be connected to a mounting base (such as a printed circuit board, PCB). After said mounting has been completed, the properties of the material of the sealing in combination with a deformability of the sealing may ensure a substantially gas flow-tight connection between mounting base and module. As a result, the electric and mechanical reliability of a module may be significantly improved. In particular in the rubber industry and for mining applications—where hydrogen sulfide, atmospheric sulphur, carbon sulfide and other corrosive gases may occur—a module with gas flow-inhibiting sealing may be used highly advantageously. Descriptively speaking, such corrosive gases may create dendrites in corrosive metal pads (made for example of copper and/or silver) of the electronic component which may involve the danger of creating undesired electrically conductive paths and thereby deteriorating the electric reliability. By providing a gas flow-inhibiting sealing between module and mounting base, the mentioned corrosive gases may be inhibited from flowing easily into an interior of the module and for instance into a soft encapsulant of the enclosure encapsulating the electronic component. In particular, convection may be stopped or strongly reduced by the gas flow-inhibiting sealing.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1:
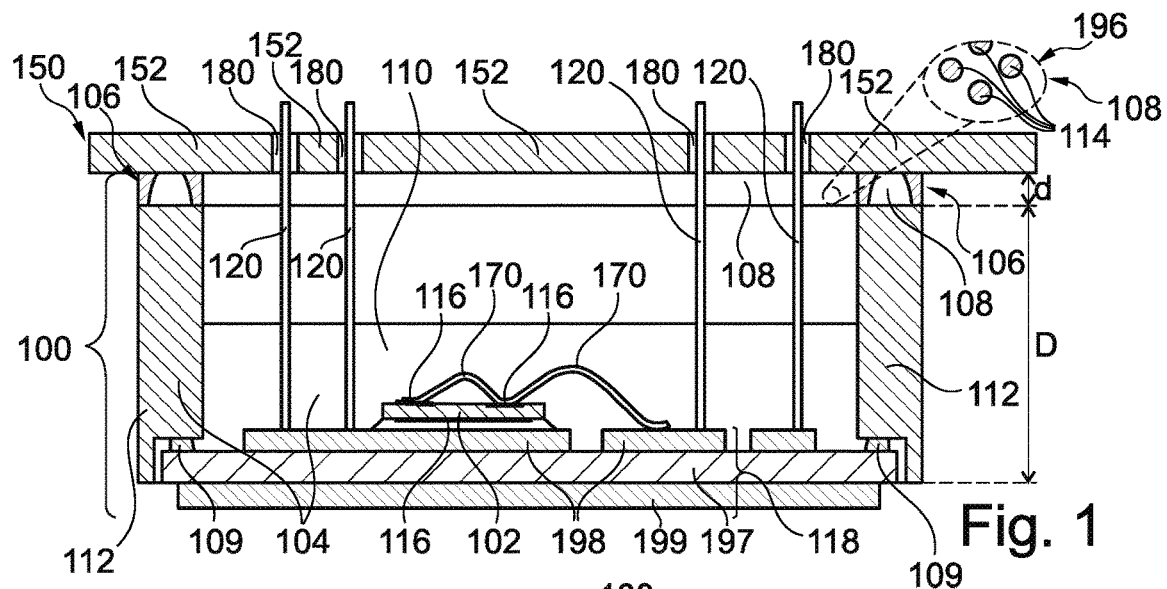
FIG. 1 illustrates an electronic device with a mounting base and a module according to an exemplary embodiment.

The illustrations in the drawings are schematic and not to scale.

Before exemplary embodiments will be described in more detail referring to the figures, some general considerations will be summarized based on which exemplary embodiments have been developed.

According to an exemplary embodiment, it may be possible to apply a sealing elastomer between a power module and a mounting base (such as a printed circuit board, PCB) for providing a protection against corrosive atmospheric gases.

Packaging materials in power semiconductor modules may contain metals that are prone to corrosive degradation and humid metal migration effects. These undesired phenomena may be caused by an exposure to water vapor, sulfur containing gases like hydrogen sulfide (H$_2$S), carbonyl sulfide (OCS), gaseous sulfur (S8) and further hazardous gases.

An elastomeric-type sealing has the advantage that it may establish a reliable connection between the power module and the PCB. Upon mounting the PCB on the module, the elastomeric sealing may also reduce pressure applied to constituents of the electronic device, for instance to rivets or sleeves connecting a carrier carrying the electronic component with needles or pins providing an electrical coupling at an exterior side of the electronic device. When soldering the electronic component on the carrier, is also possible to solder rivets or sleeves on the carrier (for instance a DCB substrate). An elastomeric sealing between enclosure and mounting base may prevent the sleeves from experiencing excessive load.

While aluminum interconnects and metallization do not show a pronounced tendency to react with those compounds due to their passivating oxide layer, sulfidation reactions of copper and silver may exhibit high reaction rates. The chemical degradation of these materials can result in failure of the semiconductor chips and of the module as a whole.

In the course of incremental deployment of such metals due to increasing power densities, it may be advantageous to address the protection of copper and silver surfaces against corrosive environmental atmospheres by a packaging design.

Conventionally, many inverters do not have a protection against corrosive gases from the environment. Some module design solutions may offer an increased robustness against corrosive gases as a side effect: In case of a solid encapsulant material instead of silicone gel based encapsulants, flow and/or diffusion of corrosive gases may be reduced. Therefore, these modules may show an increased performance in corrosive environments. But hard encapsulants require a complete redesign and adaptation of assembly processes.

Nickel plated substrates may be used for adaption of soldering properties or for optical reasons. This plating also shows a lower reactivity to $H_2S$ than copper and therefore slightly increases the robustness. However, such a solution may be inappropriate due to non-conformance with strict test requirements.

According to an exemplary embodiment, gas robustness may be established on module level rather than on component level by providing a gas flow-inhibiting (preferably gas flow-tight, and most preferably gas-tight) sealing between a module and a mounting base for assembling the module. More specifically, $H_2S$ robustness may be made a property of a system (i.e. of an electronic device as a whole), not of one component only.

After sulfurous gas (or another corrosive gas) enters an inverter (or another module type), the gas needs to reach the module openings and afterwards the reactive metal surfaces in order to generate sulfide dendrites. Conventional approaches may try to solve the $H_2S$-issue within the power module.

Advantageously, an exemplary embodiment contributes to an improvement of the gas- (and in particular $H_2S$—) robustness of modules by sealing their interconnect to the mounting base (such as a PCB), rather than by only sealing the component or circuit itself.

Power modules according to exemplary embodiments may be soldered or pressed onto a PCB. After this process, the only remaining opening to the outer atmosphere is a gap between the frame and the PCB.

In order to overcome conventional shortcomings, an exemplary embodiment provides a sealing elastomer on top of the module frame that closes this gap, once the module is mounted on the PCB. This can be applied for instance by a separate gasket or O-ring or by a dispensed and cured, flexible adhesive (for instance made of silicone, acrylate, etc.). Benefits of exemplary embodiments are low effort, high efficiency and easy applicability.

Optionally but preferably, the sealing or adhesive can contain sacrificial metal particles. Such a sealing or adhesive may be designed specifically for stopping $H_2S$ from penetrating the material. Such sacrificial material may also be deposited on top of the module's semiconductors, substrate or the like. It may be a reactive, particle filled insulating layer. The particles may comprise or may consist of copper, silver, etc., which are reactive towards gaseous sulfur and sulfide compounds. Sulfur containing gases that diffuse towards the module surface may be consumed by finely dispersed metal-containing particles in a silicone gel matrix.

Advantageously, exemplary embodiments may improve the general $H_2S$— robustness of the module (such as an inverter-type module).

Application of a sealing elastomer between module and mounting base (such as a PCB) may be provided in order to shield the component against corrosive atmospheric gases. For example, this may be implemented by:

a dispensed and thermally or optically cured (in particular UV-cured, which saves processing time) elastomer sealing made from soft (for instance Shore00-Shore A) polymer like silicone, polyurethane or polyacrylate an injection molded sealing applied to the frame a sealing gasket applied as a separate part, for instance made of silicone, thermoplastic polyurethane (TPU), ethylene propylene diene monomer rubber (EPDM), polyurethane, etc.

a gasket-type sealing as described before and designed with foamed materials in order to increase compressibility with lower compression forces The elastic modulus of the sealant according to exemplary embodiments may define the allowable compression of the sealant material. A low elastic modulus may be favorable according to exemplary embodiments, because it applies less force on the module contacts due to the lower expansion forces created by the sealant in mounted conditions. These forces may subsequently act on a rivet/pin joint or a solder joint between rivet and substrate. It may be desired that forces on these joints are not excessive. Moreover, a material with high compression and low elastic modulus may allow better compensation of part tolerances (for instance between housing and PCB).

An appropriate thickness and height of the sealing may for instance be a range from 1 mm to 3 mm. For an even better $H_2S$-robustness, the application of a Cu-filled silicone can improve the sealing functionality additionally. Forces can be render sufficiently small by implementation of screw connections between module and PCB in the corners.

According to exemplary embodiments, a reduction of gas flow paths may enhance a lifetime of modules in corrosive atmospheres. Furthermore, exemplary embodiments require only little additional material and process effort to reach high levels of corrosive gas robustness.

In the following, further exemplary embodiments of the module, the electronic device, and the method of manufacturing a module will be explained.

In the context of the present application, the term "module" may particularly denote an electronic member which may comprise one or more electronic components mounted on one or more carriers. The one or more electronic components may be enclosed in an enclosure so as to be protected mechanically and/or electrically with regard to an environment.

In the context of the present application, the term "electronic component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). In particular, the electronic component may be a semiconductor chip having at least one integrated circuit element (such as a diode or a transistor) in a surface portion thereof. The electronic component may be a naked die or may be already packaged or encapsulated.

In the context of the present application, the term "enclosure" may particularly denote a physical structure or an arrangement of multiple bodies arranged for enclosing at least part of an electronic component. Thus, such an enclosure may comprise a housing and/or an encapsulation.

In the context of the present application, the term "module interface" may particularly denote a connection area, which is configured for being connected to a mounting base such as a flat printed circuit board.

In the context of the present application, the term "gas flow-inhibiting sealing" may particularly denote a physical structure formed by one or multiple bodies, which may suppress or eliminate gas flow or convection through the sealing. In particular, convection may be stopped by the gas flow-inhibiting sealing partially or entirely. Gas diffusion through the sealing may be eliminated, suppressed or may still happen (in particular depending on the diffusion coefficient of a material, for example polymer, of the gas flow-inhibiting sealing). Diffusion can however be strongly suppressed or even minimized by a high filler content of a polymer matrix of the sealing. The material of the sealing may hence inhibit convection of gases or may significantly suppress a gas flow through the sealing and through interfaces between the sealing and surrounding material of the module or the electronic device. Preferably, the gas flow-inhibiting sealing may have a sufficient elasticity, deformability and/or softness that, when establishing a connection between the gas flow-inhibiting sealing at the module interface on the one hand and the mounting base on the other hand, gas is prevented from flowing between an interior of the module and an exterior thereof by convection. In particular, a flow of corrosive gases from an exterior of the electronic device (composed of the module and the mounting base) into an accommodation volume within the enclosure in which the electronic component is mounted may be disabled.

In an embodiment, the enclosure comprises an encapsulant at least partially encapsulating the electronic component with physical contact. For instance, such an encapsulant may be a mold-type encapsulant or a casting compound. In particular, the electronic component may be embedded in an interior of the encapsulant so that gas (and in particular $H_2S$) diffusion may be slowed down significantly.

In an embodiment, the encapsulant is a soft encapsulant, in particular a silicone gel. Such a soft encapsulant has the advantage that the electronic component encapsulated in such a soft encapsulant is protected against excessive mechanical load, since the soft material of the encapsulant may balance out hard pushes and other mechanical load. Also, an equilibration of thermal load may be balanced out by such a soft encapsulant. In other embodiments, the encapsulant may, however, be hard (for instance may be a mold compound).

In an embodiment, the enclosure comprises a housing accommodating the electronic component. Hence, the enclosure may also include a housing or casing, in which the electronic component may be housed. It is also possible that the housing defines an accommodation volume, in which not only the electronic component, but also a preferably soft encapsulant is accommodated. Descriptively speaking, the housing may function as a robust exterior mechanical protection of the enclosed electronic component. For instance, the housing may be composed of side walls surrounding the electronic component, and optionally a top plate.

In an embodiment, the housing may define or delimit the module interface. In particular, an annular flange face of the housing may define the module interface. The elastic sealing may be arranged to extend along part of or preferably along the entire annular flange face of the housing. By taking this measure, it may be ensured that the gas flow-inhibiting or even gas flow-tight sealing of the accommodation volume accommodating the electronic component may be achieved efficiently.

In an embodiment, the sealing has an annular shape. The annular shape may be a shape of a closed ring or of an open ring. For instance, the ring may have a circular or a rectangular shape. More specifically, the sealing may be preferably embodied as a ring structure for substantially fully circumferentially ensuring a gas flow-tightness of the connection between module and mounting base. A ring-shaped sealing may also provide the advantage that it will not come into contact with vertically extending current-carrying pins or needles which may become hot during operation of the module.

In an embodiment, the sealing is made of a compressible (preferably elastically deformable) material, in particular a foam. When the sealing is made of a compressible elastic material such as a foam, it may be compressed upon mounting the module on the mounting base to thereby close tiny gaps between mounting base and module. In this compressed state, the sealing may thus fill any small gaps or indentations at the module interface and may thereby ensure the desired gas flow-inhibiting or even gas-tight property.

In an embodiment, the sealing is made of an elastic material, in particular one of a Shore 00 material or a Shore A material. When being elastic in accordance with Shore 00 or Shore A requirements in terms of the ASTM D2240-00 testing standard (in particular in the most recent version in force at the priority date of the present application), substantially no gas convection can occur through the sealing. For instance, it may also be possible to use other materials for the sealing, for instance materials from the lower end of the Shore D scale (such as Shore D 35 or Shore D materials below 35). Although those materials may be harder, they may still be suitable for sealing against corrosive gases.

In an embodiment, the sealing is made of a gas-diffusion inhibiting material. For instance, a polymer matrix of the sealing may be filled for this purpose with gas-diffusion inhibiting filler particles. Advantageously, the material of the sealing may thus be of low gas-diffusivity as well. This may particularly safely protect the electronic component within the module against undesired corrosion and thereby functional deterioration.

In an embodiment, the sealing comprises corrosive gas consuming sacrificial particles. Said sacrificial particles may be configured for consuming corrosive gas, in particular hydrogen sulfide. Thus, these sacrificial particles may be configured to chemically react with the corrosive gas, in particular hydrogen sulfide. For instance, these sacrificial particles may be configured for being corroded by the corrosive gas, which can thereby be consumed. In the context of the present application, the term "gas consuming sacrificial particles" may particularly denote particles in the sealing, which are capable of being corroded by corrosive gas (such as hydrogen sulfide) reaching the sealing. Thus, the corrosive gas may be consumed by the gas-consuming sacrificial particles before the gas reaches the electronic components. Hence, an extra protection of the electronic component against undesired corrosion may be achieved. For instance, the gas-consuming sacrificial particles may be made of a base metal (or a non-noble metal), preferably of a metal being less noble than the material of pads of the electronic component. For instance, the sacrificial particles may be metal powder or metal chips arranged at and/or in elastomeric material of the sealing. Said metal powder or metal chips may for instance be made of copper, iron, silver, etc.

In an embodiment, the sealing comprises 3 to 50 volume percent corrosive gas consuming sacrificial particles (in relation to the entire sealing material). With such an amount of sacrificial particles, the remaining amount of (preferably elastomeric) sealing material may be sufficient for providing a proper sealing function while simultaneously reliably consuming remaining amounts of corrosive gases diffusing into the sealing material or through a gap between module and mounting base.

Additionally or alternatively, any surface of a constituent of the module and in particular of the electronic device may comprise corrosive gas consuming sacrificial particles. For instance, such corrosive gas consuming sacrificial particles may be applied to at least part of the enclosure, the electronic component, etc. This may further improve the corrosion protection of the pads of the electronic component.

In an embodiment, the electronic component has at least one pad made of a corrodible material, in particular a material being corrodible by a corrosive gas such as hydrogen sulfide. For instance, such a corrodible material may be at least one of copper and silver. Even when provided with corrodible pads, the electronic component may be safely prevented against undesired corrosion thanks to the gas flow-inhibiting sealing. Also the provision of the aforementioned sacrificial particles may improve the corrosion protection of copper or silver pads. Thus, since also corrodible pads may be used, the freedom of a module designer to select materials is further increased.

In an embodiment, the module comprises a carrier, in particular an at least partially electrically conductive and/or at least partially thermally conductive carrier, carrying the electronic component. In the context of the present application, the term "carrier" may particularly denote a body (preferably, but not necessarily being at least partially electrically conductive) which serves for mechanically carrying the one or more electronic components, and which may optionally also contribute to the electric interconnection between the electronic component(s) and the periphery of the module. In other words, the carrier may fulfil a mechanical carrying function and optionally an electric connection function. Preferably, but not necessarily, the carrier may be partially or entirely electrically conductive.

Such a carrier may have a mechanical support function, since it may carry the electronic component. However, it is also possible that the carrier has additionally an electric function, i.e. contributes to the electric coupling of the electronic component. In one embodiment, the carrier is a leadframe-type carrier, i.e. a patterned metal plate. In another embodiment, the carrier comprises a central electrically insulating and thermally conductive layer (such as a ceramic sheet), which is covered on both opposing main surfaces thereof with a respective electrically conductive layer structure. Said electrically conductive layer structures may be continuous and/or patterned copper layers. Hence, the carrier may, for example, be a Direct Copper Bonding (DCB) substrate. In addition to its mechanical support function, and optionally an electric function, the carrier may also have a function for promoting the thermal performance of the module. During operation of the module, a significant amount of heat may be created by the electronic component, for instance when embodied as power semiconductor chip. In such a scenario, the carrier may also be configured for removing heat out of the module, for instance towards a heat sink or the like, which may be connected to an exterior main surface of the module defined by the carrier. The main surface of the module to which a heat sink may be connected may oppose another main surface of the module at which the sealing is arranged. The main surface of the carrier to which a heat sink may be connected may oppose another main surface of the carrier at which the electronic component is arranged.

In an embodiment, the module comprises a further gas flow-inhibiting (preferably gas flow-tight) sealing between the carrier and the enclosure. A risk of corrosive gases flowing through the interface between carrier and enclosure may thus be suppressed. All material properties of the sealing described throughout the present application may also be applied to the material of the further gas flow-inhibiting sealing.

In an embodiment, the module comprises electrically conductive needles electrically coupling the electronic component with an exterior of the module, in particular the mounting base. Said electrically conductive needles may extend from the carrier on the one hand and may extend beyond the enclosure and even the sealing up to an exterior of the module. For instance, end portions of said needles may be inserted in plated holes of a mounting base configured for instance as printed circuit board. It is also possible that a solder connection is established between the mounting base and the pins on needles at an exterior side of the mounting base. Opposing end portions of the pins or needles facing the electronic component may be inserted in sleeves (or rivets) mounted (for instance soldered) on an upper main surface of a carrier on which the electronic component is mounted as well. Said needles may provide for an electric connection between the module on the one hand and the electronic environment on the other hand, for instance the mounting base. Thanks to the elastic properties of the sealing, the needles may be protected against excessive mechanical load in particular at their sleeve-sided end when module and mounting base are connected.

In an embodiment, the electronic component is a power semiconductor chip. In particular, when the electronic component is a power semiconductor chip, reliability against corrosion is of particular advantage. By the provision of the sealing at the module interface, a gas flow-inhibiting property and thus a corrosion protection of the component pads may be ensured.

In an embodiment, the mounting base comprises or consists of a printed circuit board (PCB). Such a printed circuit board is a flat body capable of providing at the same time a mechanical and an electrical connection to the module. Between the printed circuit board and the module, no corrosive gases will pass to a noticeable amount.

In an embodiment, the sealing is arranged between the module interface and the mounting base so as to inhibit gas from propagating from an exterior of the module towards the electronic component. As a consequence, the electronic component may be at least partially gas-flow sealed within the module and between the mounting base and the module. Furthermore, gas diffusion to the electronic component may be slowed down significantly by the described configuration.

In an embodiment, the mounting base and the module are connected by soldering or pressing. Hence, formation of the electronic device may be carried out with low effort.

In an embodiment, the mounting base and the module are connected in corners of the module. Such a connection may be accomplished by cooperating mounting provisions (such as mounting holes) of mounting base and module. For instance, a screw connection can be established between mounting base and module using such mounting provisions.

In an embodiment, the electronic device comprises a heat sink connected to or to be connected to an exposed main surface of the carrier of the module. For instance, a mechanical connection (such as a screw connection) may be established between the enclosure and the heat sink using a corresponding mounting provision. Connecting a heat sink to the module may enable to remove a significant amount of heat generated by the electronic component during operation of the electronic device through the carrier and to the heat sink.

In an embodiment, the module or package comprises a plurality of electronic components mounted on the carrier. Thus, the module may comprise one or more electronic components.

In an embodiment, a connection between the electronic component and the carrier is formed by a connection medium. For instance, the connection medium may be a solder structure, a sinter structure, a welding structure, and/or a glue structure. Thus, mounting the one or more electronic components on the carrier may be accomplished by soldering, sintering or welding, or by adhering or gluing.

In an embodiment, the at least one electronic component comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a MOSFET, metal oxide semiconductor field effect transistor, or an IGBT, insulated gate bipolar transistor), at least one diode, etc. In particular, circuits fulfilling a half-bridge function, a full-bridge function, etc., may be manufactured.

In an embodiment, the module may be configured as power converter, in particular one of an AC/DC power converter and a DC/DC power converter. However, also other electronic applications, such as inverters, etc. may be possible.

In an embodiment, the module comprises a clip electrically connected to an upper main surface of the electronic component. Such a clip may be a curved electrically conductive body accomplishing an electric connection with a high connection area to an upper main surface of a respective electronic component. By embedding a clip in the module for electrically connecting the electronic component to the carrier, any desired electrically conductive path may be established with low effort. Additionally or alternatively to such a clip, it is also possible to implement one or more other electrically conductive interconnect bodies in the module, for instance a bond wire and/or a bond ribbon connecting the electronic component with the carrier or connecting different pads of an electronic component.

As substrate or wafer for the semiconductor chips, a semiconductor substrate, i.e. a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages will become apparent from the following description and the appended claims, taken in conjunction with the accompanying drawings, in which like parts or elements are denoted by like reference numbers.

FIG. 1 illustrates an electronic device 150 with a mounting base 152 and a module 100 according to an exemplary embodiment.

The shown electronic device 150 comprises mounting base 152 being embodied as printed circuit board (PCB). Module 100 is mounted at its module interface 106 on the mounting base 152 with a sealing 108 in between. The gas flow-inhibiting sealing 108 may be a gasket, or may be applied by dispensing, followed by curing. Preferably, the gas flow-inhibiting sealing 108 may establish a gas flow-tight connection between module 100 and mounting base 152.

The module 100 comprises an electronic component 102, such as a power semiconductor chip, for instance comprising a field effect transistor (FET). An enclosure 104 encloses the electronic component 102 and defines a module interface 106 at which the module 100 is to be mounted on the mounting base 152. Furthermore, the gas flow-inhibiting sealing 108 at the module interface 106 is provided and configured for inhibiting corrosive gas (such as $H_2S$) from propagating from an exterior of the electronic device 150 towards the electronic component 102 enclosed between enclosure 104 and mounting base 152.

In the shown embodiment, the enclosure 104 is composed of two parts. A first or interior part of the enclosure 104 is embodied as a soft encapsulant 110 (for instance made of a silicone gel) which directly encapsulates the electronic component 102 with physical contact, for instance is applied by casting or molding. A second or exterior part of the enclosure 104 is embodied a rigid casing or housing 112 which may be made of plastic and accommodates the electronic component 102 and the soft encapsulant 110. For instance, the housing 112 defines the module interface 106. The housing 112 may have a vertical extension, D, which may for instance be 12 mm A gap between the housing 112 and the mounting base 152 may have a vertical extension, d, which may for instance be in a range from 1 mm to 2 mm By closing the gap with sealing 108, the robustness of the interior of the electronic device 150 against corrosive gases and environments may be significantly improved.

Referring again to the gas flow-tight sealing 108, it may have an annular shape. When the sealing 108 is configured as a ring, any direct physical contact of the sealing material with hot pins or current-carrying needles 120 (described below in further detail) may be prevented. Preferably, the sealing 108 is made of an elastically compressible material such as a foam. The material of the sealing 108 may then be compressed elastically by the application of pressure, in particular applied when the module 100 is assembled (for instance screwed, glued or soldered) to the mounting base 152. Hence, the sealing 108 is preferably made of an elastic material. The sealing material may be, for example, a Shore 00 material or a Shore A material. Preferably, the material of the sealing 108 is gas flow-tight so that flowing corrosive gases such as $H_2S$ are inhibited from passing the material of the sealing 108. As shown, the sealing 108 is arranged between the module interface 106 and the mounting base 152 so as to inhibit gas from propagating from an exterior of the module 100 towards the electronic component 102.

In a preferred embodiment and as shown in a detail 196 of FIG. 1, said gas flow-tight elastic sealing 108 additionally comprises corrosive gas consuming sacrificial particles 114 functioning as chemical getter particles. For instance, such gas consuming sacrificial particles 114 may be metallic power embedded in an elastomeric matrix of the sealing 108. Advantageously, the gas consuming sacrificial particles 114 may be made of a corrodible material, more specifically corrodible by corrosive gases such as $H_2S$. Hence, remaining small amounts of corrosive gases diffusing into the sealing 108 may be consumed by the gas consuming sacrificial particles 114 which are thereby corroded and hence disabled for corroding pads of the electronic component 102. By taking this measure, the reliability of the corrosion protection of an interior of the module 100 and in particular of the enclosed electronic component 102 may be additionally improved. In other words, the elastic gas flow-tight material of the matrix of the sealing 108 may synergistically cooperate with the gas corrodible sacrificial particles 114 for improving the corrosion protection of the electronic component 102.

Although not shown in FIG. 1, gas corrodible sacrificial particles 114 may also be embedded in soft encapsulant 110, which may be a silicone gel. A silicone gel may allow to a certain extent an undesired diffusion of corrosive gas (such as hydrogen sulfide). By providing encapsulant 110 with gas corrodible sacrificial particles 114 (for instance metal powder), any corrodible gas entering the interior of the module 100 and then the encapsulant 110 may be consumed by the gas corrodible sacrificial particles 114 in the encapsulant 110 before reaching the corrodible electrodes or pads 116 of the electronic component 102.

In view of this fact, the electronic component 102 may have one or more pads 116 made of a corrodible material such as copper and/or silver. Since this material is reliably protected against corrosion in the electronic device 150, the freedom of design of a module designer concerning usable pad materials may be extended to gas corrodible pad metals without the risk of corrosion.

Furthermore, vertically extending electrically conductive needles 120 may be provided which electrically couple the electronic component 102 and the carrier 118 with an exterior of the module 100, more precisely with the mounting base 152. The needles 120 may also extend through the mounting base 152. More precisely, bottom ends (according to FIG. 1) of the needles 120 may be connected at an upper main surface of the carrier 180. For instance, rivets or sleeves (not shown in FIG. 1) may be connected at the upper main surface of the carrier 118, for instance by soldering. Furthermore, top ends (according to FIG. 1) of the needles 120 may be guided through the mounting base 152 and may even protrude beyond the upper side of the mounting base 152. It may also be possible to establish a connection, for instance a solder connection, between the mounting base 152 and the upper ends of the needles 120 at an exterior side of the mounting base 152.

As shown as well in FIG. 1, the module 100 comprises carrier 118 carrying the electronic component 102. The electronic component 102 may be soldered on the carrier 118. In the shown embodiment, the carrier 118 comprises a central thermally conductive and electrically insulating plate 197 (for instance made of a ceramic) covered on both opposing main surfaces thereof with a respective electrically conductive layer 198, 199 (such as a continuous or patterned copper or aluminium layer). For instance, the carrier 118 may be a Direct Copper Bonding (DCB) substrate or a Direct Aluminium Bonding (DAB) substrate. It is also possible to embody the carrier 118 as Active Metal Brazing (AMB) substrate. The component 102 is mounted on the top-sided electrically conductive layer 198. The bottom-sided electrically conductive layer 199 may be connected to a heat sink (not shown) for promoting heat removal out of the module 100 during operation thereof.

Thus, the outer layer 199 of the carrier 118 is configured for mounting a heat sink (not shown) thereon in order to efficiently remove heat out of the module 100, which is generated by electronic component 102 mounted on the interior layer 198 of the carrier 118. Said electronic component 102 may, for instance, be a power semiconductor chip. Electric connection of the electronic component 102 can be accomplished by the carrier 118 (in particular by the inner electrically conductive layer 198 thereof) and by electrically conductive connection elements 170 connecting the carrier 118 with the pads 116 on an upper main surface of the electronic component 102. Said electrically conductive connection elements 170 are here embodied as bond wires, but may alternatively be bond ribbons or clips.

As shown as well, the electronic component 102 mounted on the carrier 118 is enclosed within the enclosure 104, which is composed of soft encapsulant 110 and wall of housing 112.

The module 100 further comprises a further gas flow-inhibiting sealing 109 between the carrier 118 and the housing 112 of the enclosure 104. The further gas flow-inhibiting sealing 109 may be an absorbent glue bead. The further gas flow-inhibiting sealing 109 may be made of the same material as the gas flow-inhibiting sealing 108. The risk of corrosive gases flowing through the interface between carrier 118 and enclosure 104 may be suppressed by the further sealing 109. For instance, the further gas flow-inhibiting sealing 109 may be a silicone glue further improving robustness against corrosive gases.

The electrically conductive needles 120 extend from the carrier 118 through the encapsulant 110 and through sealing 108 at module interface 106 at which the module 100 faces mounting base 152. For instance, the module 100 and the mounting base 152 may be connected by screwing, soldering, sintering, gluing and/or mechanically pressing. During such a connection, the sealing 108 ensures that no corrosive gases can propagate from an exterior of the illustrated electronic device 150 up to the electronic component 102. The electronic component 102 may thus be provided with corrosive pads 116, for instance made of copper and aluminium. Since corrosive gases are, however, safely prevented for reaching the electronic component 102, no issues with corrosion may occur. Mounting holes 180 in the PCB-type mounting base 152 ensure that the needles 120 are connected mechanically and electrically with the mounting base 152. In particular, the mounting holes 180 may be plated for establishing such an electric connection. The needles 120 may be guided through the mounting holes 180 substantially without any gaps in between. If very small gaps remain, the amount of corrosive gas flowing or diffusing through such tiny gaps may be sufficiently small, and in particular convection by gas flow may be strongly suppressed or even fully eliminated.

As can be taken from detail 196 shown in FIG. 1, the sealing 108 may be made of an elastomeric material being itself substantially gas convection-proof or may allow a gas flow only to a very minor extent. The sealing 108 may have embedded therein corrosive particles 114. Said corrosive particles 114 may, for instance, be made of iron, copper or another base metal, so that any corrosive gases in an electronic environment of the illustrated electronic device 150 will corrode the sacrificial particles 114 of the sealing 106 rather than the pads 116 of the electronic component 102.

As a result of the described configuration, the electronic component 102 is at least partially gas-flow sealed within the module 100 and between the mounting base 152 and the module 100, in particular against the intrusion of corrosive gases such as hydrogen sulfide.

FIG. 2 to FIG. 9 illustrate images of constituents of an electronic device 150 and of modules 100 according to exemplary embodiments.

Figure 2:
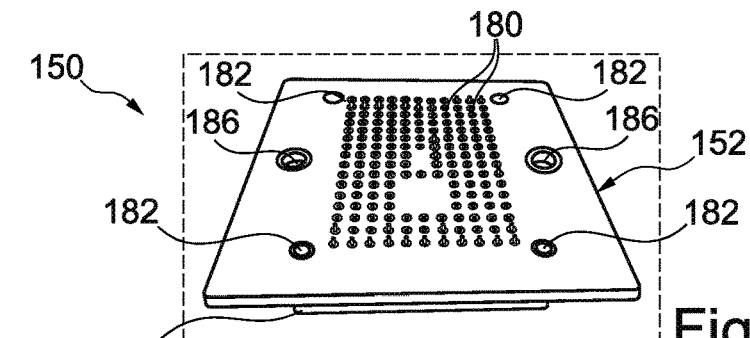
FIG. 2 to FIG. 9 illustrate images of constituents of an electronic device and modules according to exemplary embodiments.

Referring to FIG. 2, mounting base 152, which is here embodied as printed circuit board, is illustrated from a side facing away from the module 100. As shown, the mounting base 152 has first mounting holes 180 through which the electrically conductive needles 120 may be guided. The first mounting holes 180 may be plated for establishing an electrically conductive connection with the needles 120. Thus, the first mounting holes 180 may be plated through holes. Moreover, second mounting holes 182 are provided in corners of the mounting base 152 for establishing a mechanical connection with the module 100 having corresponding mounting holes 184 in corners, see FIG. 3 and FIG. 4. Preferably, the mounting base 152 and the module 100 are connected in corners of the module 100. This may promote reliability and does not disturb the function of the sealing 108.

Figure 3:
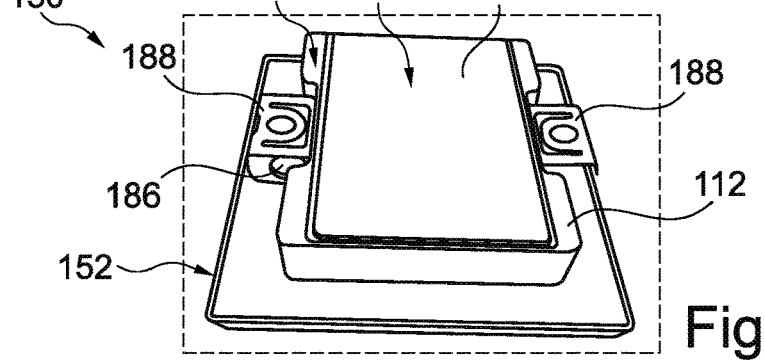

Again referring to FIG. 2, third mounting holes 186 are provided along opposing side edges of the mounting base 152 for establishing a connection with mechanical connection elements 188 of modules 100 shown in FIG. 3. For instance, the mechanical connection elements 188 may be metal springs. The mechanical connection elements 188 may be used for establishing a mechanical connection (for instance a screw connection) with a heat sink (not shown) to be attached to an exposed lower main surface of the carrier 118. Such a heat sink may remove heat created by the electronic component 102 during operation of the electronic device 150. Said heat may be conducted through the thermally conductive carrier 118 up to the heat sink for cooling the module 100.

For assembling the electronic device 150 of FIG. 3, the module 100 may be connected with the mounting base 152. Subsequently, the obtained arrangement may be connected with the heat sink using connection element 188 for attachment.

Figure 4:
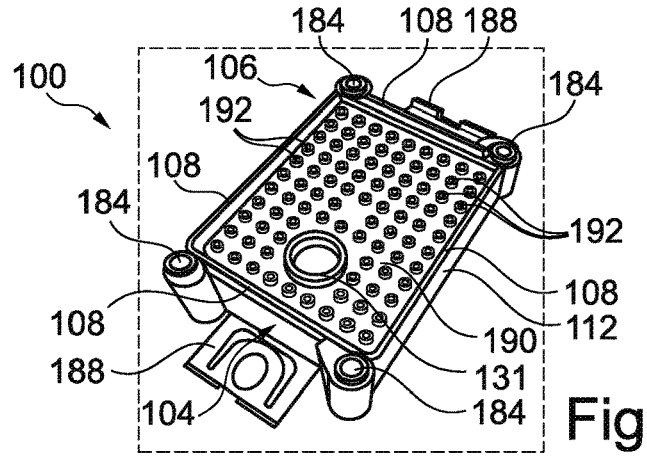

FIG. 4 shows the module 100 of FIG. 2 and FIG. 3 without mounting base 152.

Figure 5:
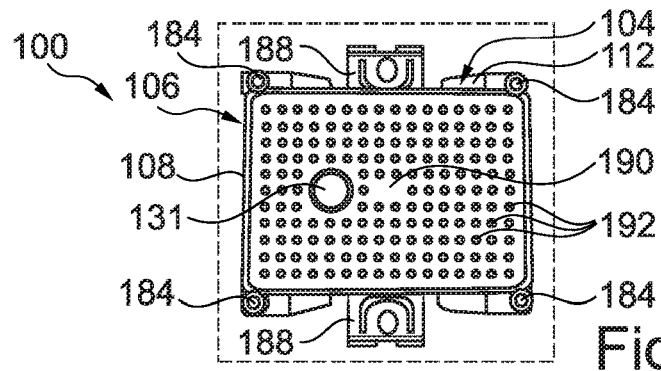
Figure 6:
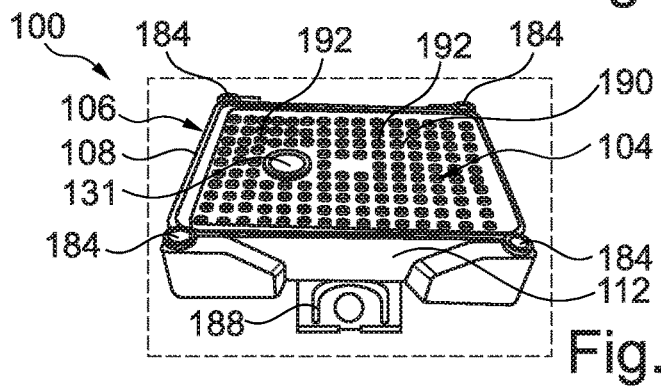
Figure 7:
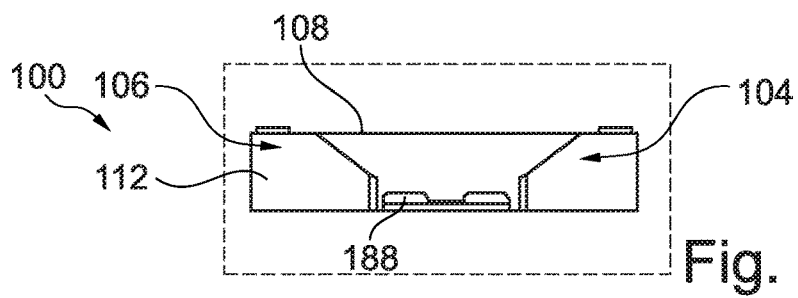

In FIG. 5, FIG. 6 and FIG. 7, different views of the module 100 without mounting base 152 are shown. It can be seen that sealing 108 is here embodied by four straight strips of elastic material being arranged in a substantially ring-shaped manner with short interruptions only in the regions of the corners corresponding to the mounting holes 184. For instance, the material of the sealing 108 may be dispensed in the illustrated shape. Alternatively, the sealing 108 may be provided as a separate piece to be attached to the flange face of the housing 112, for instance as a separate gasket. FIG. 4 to FIG. 7 also show a top plate 190 of the casing 112 of the enclosure 104 being provided with forth mounting holes 192 cooperating with the first mounting holes 184 of the mounting base 162 for guiding the electrically conductive needles 120 therethrough. Furthermore, one or more filling ports 131 may be provided as through holes in the top plate 190 for filling in material for producing the soft encapsulant 110.

Figure 8:
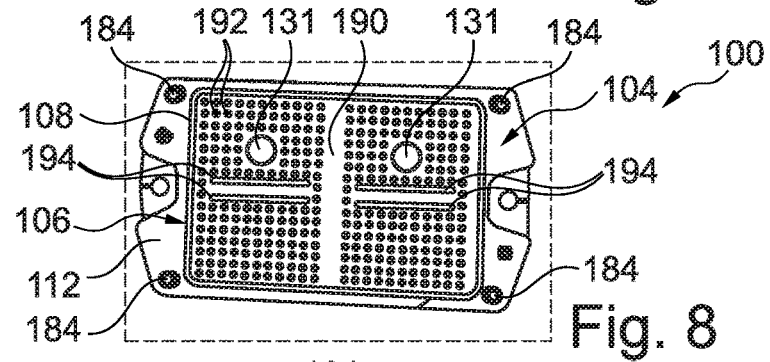
Figure 9:
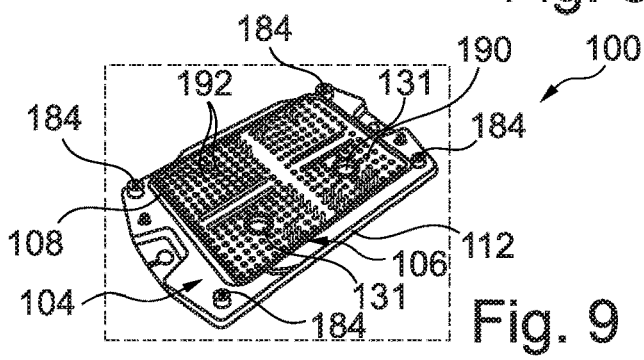

Referring to FIG. 8 and FIG. 9, another embodiment of a module 100 shown in which the top plate 190 is additionally provided with parallel slits 194.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A module, comprising:
an electronic component;
an enclosure at least partially enclosing the electronic component and defining a module interface at which the module is configured to be mounted on a mounting base; and
a gas flow-inhibiting sealing at the module interface and configured to inhibit gas from propagating from an exterior of the module towards the electronic component,
wherein the gas flow-inhibiting sealing is made of a compressible material.

2. The module of claim 1, wherein the enclosure comprises an encapsulant at least partially encapsulating the electronic component with physical contact.

3. The module of claim 1, wherein the enclosure comprises a housing accommodating the electronic component.

4. The module of claim 3, wherein the housing defines the module interface.

5. The module of claim 1, wherein the gas flow-inhibiting sealing has a substantially annular shape.

6. The module of claim 5, wherein the substantially annular shape is a closed ring or an open ring.

7. The module of claim 1, wherein the compressible material is a foam.

8. The module of claim 1, further comprising a carrier that carries the electronic component.

9. The module of claim 8, further comprising a further gas flow-inhibiting sealing between the carrier and the enclosure.

10. The module of claim 1, wherein at least one of:
the gas flow-inhibiting sealing comprises a gas-diffusion inhibiting material;
the gas flow-inhibiting sealing comprises sacrificial particles configured to consume corrosive gas;
the electronic component has at least one pad made of a corrodible material being corrodible by the corrosive gas;
electrically conductive needles electrically couple the electronic component with an exterior of the module; and
the electronic component is a power semiconductor chip.

11. The module of claim 1, wherein the gas flow-inhibiting sealing is a gas flow-tight sealing.

12. A module, comprising:
an electronic component;
an enclosure at least partially enclosing the electronic component and defining a module interface at which the module is configured to be mounted on a mounting base; and
a gas flow-inhibiting sealing at the module interface and configured to inhibit gas from propagating from an exterior of the module towards the electronic component,
wherein the gas flow-inhibiting sealing is made of an elastic material.

13. The module of claim 12, wherein the elastic material is a Shore 00 material, a Shore A material, or a Shore D material below 35.

14. A module, comprising:
an electronic component;
an enclosure at least partially enclosing the electronic component and defining a module interface at which the module is configured to be mounted on a mounting base;
a gas flow-inhibiting sealing at the module interface and configured to inhibit gas from propagating from an exterior of the module towards the electronic component;
a carrier that carries the electronic component; and
a further gas flow-inhibiting sealing between the carrier and the enclosure.

15. A module, comprising:
an electronic component;
an enclosure at least partially enclosing the electronic component and defining a module interface at which the module is configured to be mounted on a mounting base; and
a gas flow-inhibiting sealing at the module interface and configured to inhibit gas from propagating from an exterior of the module towards the electronic component,
wherein at least one of:
the gas flow-inhibiting sealing comprises a gas-diffusion inhibiting material;
the gas flow-inhibiting sealing comprises sacrificial particles configured to consume corrosive gas;
the electronic component has at least one pad made of a corrodible material being corrodible by the corrosive gas;
electrically conductive needles electrically couple the electronic component with an exterior of the module; and
the electronic component is a power semiconductor chip.

16. A module, comprising:
an electronic component;
an enclosure at least partially enclosing the electronic component and defining a module interface at which the module is configured to be mounted on a mounting base; and
a gas flow-inhibiting sealing at the module interface and configured to inhibit gas from propagating from an exterior of the module towards the electronic component,
wherein the gas flow-inhibiting sealing is a gas flow-tight sealing.

* * * * *